US005917847A

United States Patent [19]
Sun

[11] Patent Number: 5,917,847
[45] Date of Patent: Jun. 29, 1999

[54] INDEPENDENTLY ADDRESSABLE SEMICONDUCTOR LASER ARRAYS WITH BURIED SELECTIVELY OXIDIZED NATIVE OXIDE APERTURES

[75] Inventor: Decai Sun, Sunnyvale, Calif.

[73] Assignee: Xerox Corporation, Stamford, Conn.

[21] Appl. No.: 08/938,087

[22] Filed: Sep. 26, 1997

[51] Int. Cl.$^6$ ...................................................... H01S 3/19
[52] U.S. Cl. ............................................... 372/50; 372/46
[58] Field of Search ................................ 372/45, 46, 50

[56] References Cited

U.S. PATENT DOCUMENTS

| | | | |
|---|---|---|---|
| 4,230,997 | 10/1980 | Hartman et al. | 372/50 |
| 5,262,360 | 11/1993 | Holonyak, Jr. et al. | 438/767 |
| 5,327,448 | 7/1994 | Holonyak, Jr. et al. | 372/94 |
| 5,353,295 | 10/1994 | Holonyak, Jr. et al. | 372/50 |
| 5,376,583 | 12/1994 | Northrup et al. | 438/23 |
| 5,386,428 | 1/1995 | Thornton et al. | 372/50 |
| 5,400,354 | 3/1995 | Ludowise et al. | 372/46 |
| 5,403,775 | 4/1995 | Holonyak, Jr. et al. | 372/46 |
| 5,517,039 | 5/1996 | Holonyak, Jr. et al. | 372/46 |

OTHER PUBLICATIONS

Cheng et al., "Lasing Characteristics of High–Performance Narrow–Stripe InGaAs–GaAs Quantum Well Lasers Confined by AlAs Native Oxide", *IEEE Photonics Technology Letters*, vol. 8, No. 2, Feb. 1996, pp. 176–178.

Carraci et al., "High–performance planar native–oxide buried–mesa index–guided AlGaAs–GaAs quantum well heterostructure lasers", *Appl. Phys. Lett.*, vol. 61 (3), Jul. 20, 1992, pp. 321–323.

*Primary Examiner*—Rodney Bovernick
*Assistant Examiner*—Quyen Phan Leung
*Attorney, Agent, or Firm*—William Propp

[57] ABSTRACT

The present invention provides a independently addressable, high density, edge emitting laser array structure formed by a lateral wet oxidation process. The aperture of the laser structure is formed by selective layer intermixing and lateral wet oxidation from adjacent grooves etched in the laser structure.

43 Claims, 7 Drawing Sheets

INDEPENDENTLY ADDRESSABLE SEMICONDUCTOR LASER ARRAYS WITH BURIED SELECTIVELY OXIDIZED NATIVE OXIDE APERTURES

BACKGROUND OF THE INVENTION

This invention relates to a monolithic semiconductor laser array and, more particularly, to an independently addressable, high density, laser array using a buried selectively oxidized native oxide layer to form an optical aperture.

Monolithic arrays of solid state semiconductor lasers are very desirable light sources for high speed laser printing, optical fiber communications and other applications. A common laser structure is a so-called "edge emitting laser" where light is emitted from the edge of a monolithic structure of semiconductor layers.

Generally, formation of native oxides in a laser is an important step to achieving good electrical and optical confinement in the structure. One approach in oxide formation is commonly known as the "surface-oxidation" technique. Examples of such an approach are described in U.S. Pat. No. 5,327,448 entitled "Semiconductor Devices and Techniques For Controlled Optical Confinement" and U.S. Pat. No. 5,262,360 entitled "AlGaAs Native Oxide," both of which were invented by Holonyak et al.

As discussed in these patents, under the "surface-oxidation" approach, a cap GaAs layer is placed above a thick AlGaAs layer with a high aluminum content, which is deposited above the active layer of a laser structure. Under this "surface-oxidation" approach, the surface of the sample is first patterned with silicon nitride, protecting and exposing parts of the GaAs cap layer. The exposed GaAs areas are then removed by chemical etching exposing the surface of the underlying AlGaAs layer which has a high aluminum content. The sample is then oxidized in water vapor where the oxidation in the AlGaAs layer proceeds downwards from the surface until it reaches the active layer which has a lower aluminum content. Since the active layer has a lower aluminum content, the oxidation process essentially stops when it reaches the active layer, providing electrical and optical confinement to the laser structure.

Another approach towards forming oxides is a so-called "buried-layer" oxidation approach which is described in "Lasing Characteristics of High-Performance Narrow Stripe InGaAs-GaAs Quantum-Well Lasers Confined by AlAs Native Oxide," IEEE Photonics Technology Letters, Vol. 8, No. 2, p. 176 (February 1996) by Cheng et al. Under this approach, an AlAs layer is placed above and below the active layer of a laser structure. Then, grooves are etched, forming an exposed stripe mesa structure between the grooves. As a result of the etching, the AlAs layers sandwiching the active layer are exposed along the sidewalls of the mesa. During an oxidation process, these AlAs layers are oxidized laterally from the sidewalls of the mesa inwards towards the center of the mesa. However, other layers in the structure remain essentially unoxidized since their aluminum content is lower. The oxidized AlAs layers reduce the effective refractive index of the regions both above and underneath them, providing lateral electrical and optical confinement to the sandwiched active layer. Another discussion regarding the "buried-layer" technique is described in "High-Performance Planar Native-Oxide Buried-Mesa Index-Guided AlGaAs-GaAs Quantum Well Heterostructure Lasers," Appl. Phys. Lett. vol. 61 (3), p. 321 (July 1992) by Caracci et al.

The key disadvantage of the "buried-layer" approach is the difficulty in controlling the amount of oxidation. Because the oxidation rate of AlAs or AlGaAs with a high aluminum content depends upon aluminum composition and process variations, any variation in aluminum composition or process parameters will be reflected by changes in the oxidation rate, which in turn creates uncertainty in the amount of oxidation. The process is relatively temperature-sensitive. Therefore, when such a technique is applied to forming lasers, the devices typically have manufacturability and yield problems.

The contact layer for an electrode is directly deposited on top of the etched mesa. Since the mesa size has to be big enough to accommodate a big contact pad (on the order of 50 mm by 50 mm typically) for wire bonding, this structure makes prohibitive a closely spaced array.

With laser arrays, it is desirable to position the laser elements as densely as possible. However, closely spaced elements are difficult to electrically connect and to cool through heatsinking. Furthermore, closely spaced laser elements tend to interact electrically, optically and/or thermally. These interactions, called "crosstalk", are usually undesirable.

Individually, lasers are low power output devices. Arrays of lasers can be used to increase the power output and to simplify optical system design. To provide and maintain good optical alignment of the laser elements of the array with one another and to minimize the assembly involved, arrays have been fabricated so that the laser elements are in a single monolithic semiconductor structure.

Another problem is making each individual laser element in the array independently addressable. As the laser elements are spaced closer together in higher densities, it is progressively more difficult to separately, individually and independently cause each element to emit light.

The individual contacts that make the emitters of the array independently addressable should be directly aligned with the laser cavity. Alignment is advantageous because it minimizes the electrical resistance, the current spreading to each emitter, and the size of the electrode. It also places the heat-sinking as close to the emitting area as possible. Minimizing current spreading helps electrically isolate the individual laser elements.

Accordingly, there is a need for developing a monolithic, independently addressable laser array with accurately defined and controlled native oxide regions to form an optical aperture.

SUMMARY OF THE INVENTION

The present invention provides a independently addressable, high density, edge emitting laser array structure formed by a lateral wet oxidation process. The aperture of the laser structure is formed by selective layer intermixing and lateral wet oxidation from adjacent grooves etched in the laser structure.

The semiconductor structure can have several different semiconductor materials of different conductivity types to form the independently addressable, high density, edge emitting laser array. An oxidation layer either above or below the active region of the laser structure is intermixed by layer disordering to form the aperture than lateral wet oxidation forms native oxide regions for confinement purposes.

Other objects and attainments together with a fuller understanding of the invention will become apparent and

DETAILED DESCRIPTION OF THE PREFERRED EMBODIMENTS

Figure 1:
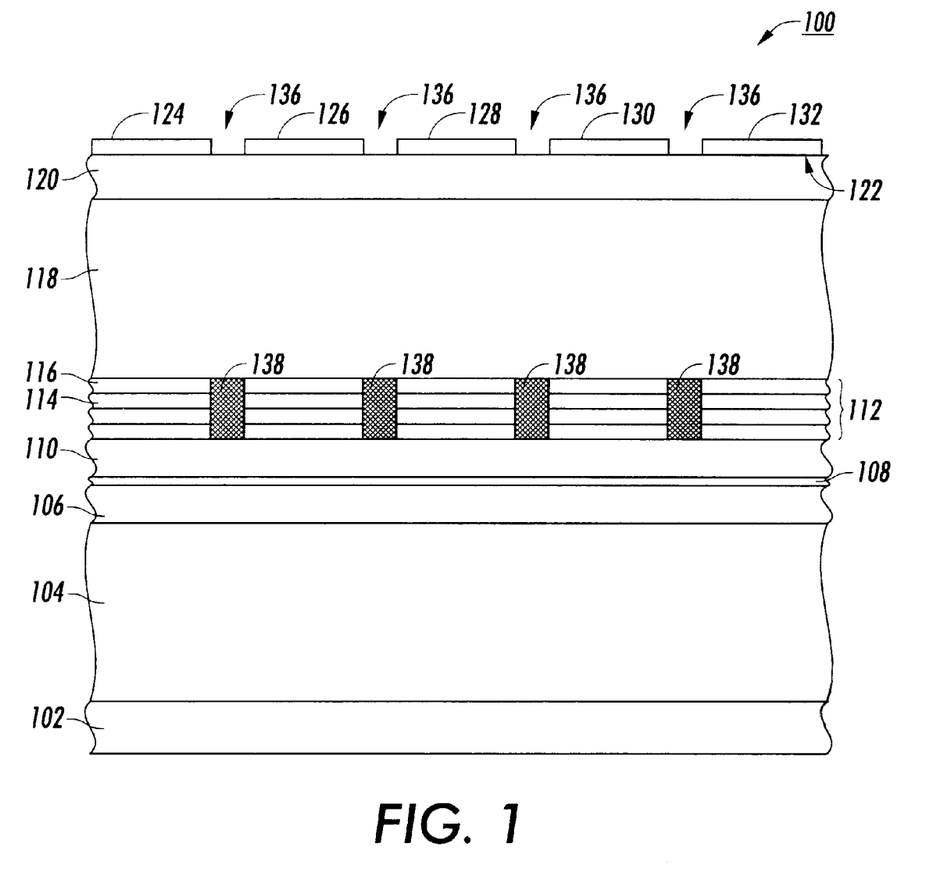
FIG. 1 is a side view of the semiconductor layers of the edge emitting laser array structure of the present invention after layer disordering.

FIG. 1 illustrates an independently addressable, high density, quad-spot semiconductor laser structure 100 fabricated by selective layer intermixing and lateral wet oxidation in accordance to the present invention.

As shown in FIG. 1, an n-type $Al_{0.7}Ga_{0.3}As$ lower cladding layer 104 is grown on an n-type GaAs substrate 102 using a well-known epitaxial deposition process commonly referred to as metal-organic chemical vapor deposition (MOCVD). Other deposition processes such as liquid phase epitaxy (LPE), molecular beam epitaxy (MBE), or other known crystal growth processes can also be used. The aluminum mole fraction of the lower cladding layer 104 is approximately 70 percent and the doping level of the lower cladding layer is approximately $1\times10^{18}$ cm$^{-3}$. The thickness of the AlGaAs cladding layer 104 is approximately one micron ($\mu$m). The doping level of the n-type GaAs substrate 102 is approximately $5\times10^{18}$ cm$^{-3}$ or higher. Although not illustrated, a buffer layer may be deposited prior to the deposition of the lower cladding layer 104 in the event that lower throughputs are acceptable.

Above these layers is an undoped $Al_{0.4}Ga_{0.6}As$ lower confinement layer 106, which has an aluminum content of about 40% and a thickness of about 120 nanometers. After this lower confinement layer 106 has been deposited, a GaAs active layer 108 is deposited, which should result in a light emission at 840 nanometers. The active layer 108 may be a single quantum well, a multiple quantum well, or a layer with thickness greater than that of a quantum well. The thickness of a quantum well typically ranges from five to twenty nanometers and, in this embodiment, is eight nanometers. Above the active layer 108 is an undoped $Al_{0.4}Ga_{0.6}As$ upper confinement layer 110. The aluminum content of this confinement layer 110 is typically 40% and a thickness of about 120 nanometers. The lower and upper confinement layers, 106 and 110, together with the active layer 106, generally produce a laser structure with a lower threshold current and a smaller optical divergence.

After the upper AlGaAs confinement layer 110 has been formed, a p-type oxidation layer 112 is deposited, which is used to form the laser aperture. The laser aperture controls the current flow and thus the lasing location in the active layer 108.

The oxidation layer 112 consists of a superlattice of five semiconductor layer pairs of p-AlAs layers 114 and p-$Al_{0.4}Ga_{0.6}As$ layers 116. Each of these two 114 and 116 in the oxidation layer 112 has a thicknesses of 10 nanometers. The aluminum content of the AlGaAs layers 116 is typically 40 percent. The p-AlAs layers 114 and p-$Al_{0.4}Ga_{0.6}As$ layers 116 have a heavy p doping with a magnesium doping level of $5\times10^{18}$ cm$^{-3}$. These pairs of two embedded layers allow for intermixing of layers using a layer disordering process and lateral wet oxidation.

Since the oxidized regions of the embedded layers which determine the current path are above the active layer, current confinement is improved. Generally, if the oxidized regions are located in a p-type region, current spreading effects are minimized because of the shorter diffusion length or lower mobility of holes under these circumstances.

After the oxidation layer 112 has been formed from the deposition of the five pairs of AlAs layers 114 and AlGaAs layers 116, a p-type $Al_{0.7}Ga_{0.3}As$ upper cladding layer 118 of about one micron thickness is deposited. Typically, this cladding layer 118 has an aluminum content of 70% and a magnesium doping level of $1\times10^{18}$ cm$^{-3}$. Upon the upper p-type $Al_{0.7}Ga_{0.3}As$ cladding layer 118 is deposited a p+-GaAs cap layer 120 to facilitate the formation of ohmic contacts to the laser structure. The p+-GaAs cap layer 120 is typically 100 nanometers thick with a magnesium doping of $1\times10^{19}$ cm$^{-3}$.

In the formation of the semiconductor laser structure 100, the layer disordering process occurs first before the lateral oxidation process.

Thus, after all the semiconductor layers of the semiconductor structure 100 of FIG. 1 have been deposited, five silicon nitride stripes 124, 126, 128, 130 and 132 approximately 80 nanometers thick are formed on the upper surface 122 of the semiconductor structure by a photolithographic process. The five silicon nitride stripes are parallel, 50 microns wide, spaced 3 microns apart and run lengthwise down the surface 122 of the semiconductor structure. In this case, since p-type dopants are used to induce layer disordering, the silicon nitride stripes 124, 126, 128, 130 and 132 cover the surface 122 except for the open window regions 136 between the stripes. The oxidation layers 138 below the open window regions 136 will be intermixed.

The semiconductor structure is then annealed in a gallium (Ga) rich environment at temperature of approximately 840° C. for approximately 8 hours. The AlAs/AlGaAs oxidation layer 112, which is under the open window region 136, are intermixed to form the intermixed region 138.

The embedded disordering agent is created by the dopants in the AlAs layer 114. During the IILD process, intermixing of the Group III elements, gallium and aluminum, occurs in the region 138 under the open window 136 not covered by the silicon nitride stripes 124, 126, 128, 130 and 132.

It is well-known that IILD can be used to intermix Group III atoms in a III–V semiconductor heterostructure as shown in U.S. Pat. No. 5,386,428, entitled "Stacked Active Region Laser Array For Multicolor Emission," by Thornton et al. It is also well-known that zinc or beryllium diffused under gallium-rich or arsenic-deficient conditions can be used to produce p-type disordering. A discussion of such a process can be found in U.S. Pat. No. 5,376,583, entitled "Method for Producing P-Type Impurity Induced Layer Disordering" by Northrup et al. Therefore, impurity-induced layer intermixing using a variety of impurity sources is well known. Under this embodiment, a layer disordering process is used to define the regions within which oxidation can occur. In other words, a layer disordering process is performed prior to the oxidation process. During this pre-oxidation disordering process, the Group III elements of the layers in the heterostructure intermix, altering the aluminum composition of each layer.

During the intermixing process, the aluminum composition decreases in the layer which originally had a high aluminum content while the aluminum composition increases in the layer with a low aluminum content. After a typical IILD process, the region of the AlAs layer 114 under the open window 136 has an aluminum content of less than 100% while at the same time, regions in the AlGaAs layer 116 have a higher aluminum content. This process depends upon the difference in the aluminum mole fractions of two regions—the region in which oxidation is desired and the region in which oxidation is not desired. In other words, this invention does not depend upon the absolute aluminum mole fractions of the two regions. Since the oxidation rates in aluminum-containing semiconductors generally depend upon the aluminum mole fraction in an exponential manner, this process tends to be very reproducible. Consequently, the yield of the lasers formed by the present invention should be higher.

The intermixing introduces gallium into or removes aluminum from the AlAs layer 114, thus lowering its aluminum mole fraction. Likewise, the intermixing introduces aluminum into or removes gallium from the AlGaAs layers 116, increasing their aluminum mole fractions. Minimal intermixing of Group III elements occurs under the areas capped by silicon nitride stripes 124, 126, 128, 130 and 132 since the silicon nitride prevents the arsenic from escaping. This approach allows for the intermixing of some interfaces without intermixing others above, below or next to them. The silicon nitride stripes is used to define the boundaries of the intermixed region 138 in a direction perpendicular to the surface of the substrate. Generally, it has been observed that a relatively sharp interface is created between the intermixed and the unintermixed region. Since the regions of the heterostructure which would be intermixed are defined by the placement of an embedded disordering agent in the structure, highly localized intermixing can be accomplished. Other sources which can cause layer disordering include other p- or n-type impurities as well as Group III or V vacancies.

The AlAs/AlGaAs oxidation layer under the open window region is intermixed so that the Al content in the AlAs layers is lowered, but outside the window regions where the surface is covered by the silicon nitride stripes, the oxidation layer is stable and the AlAs layers stay unaltered. In the case that the oxidation layer is fully intermixed, the Al content is 0.7 in the intermixed region.

Figure 2:
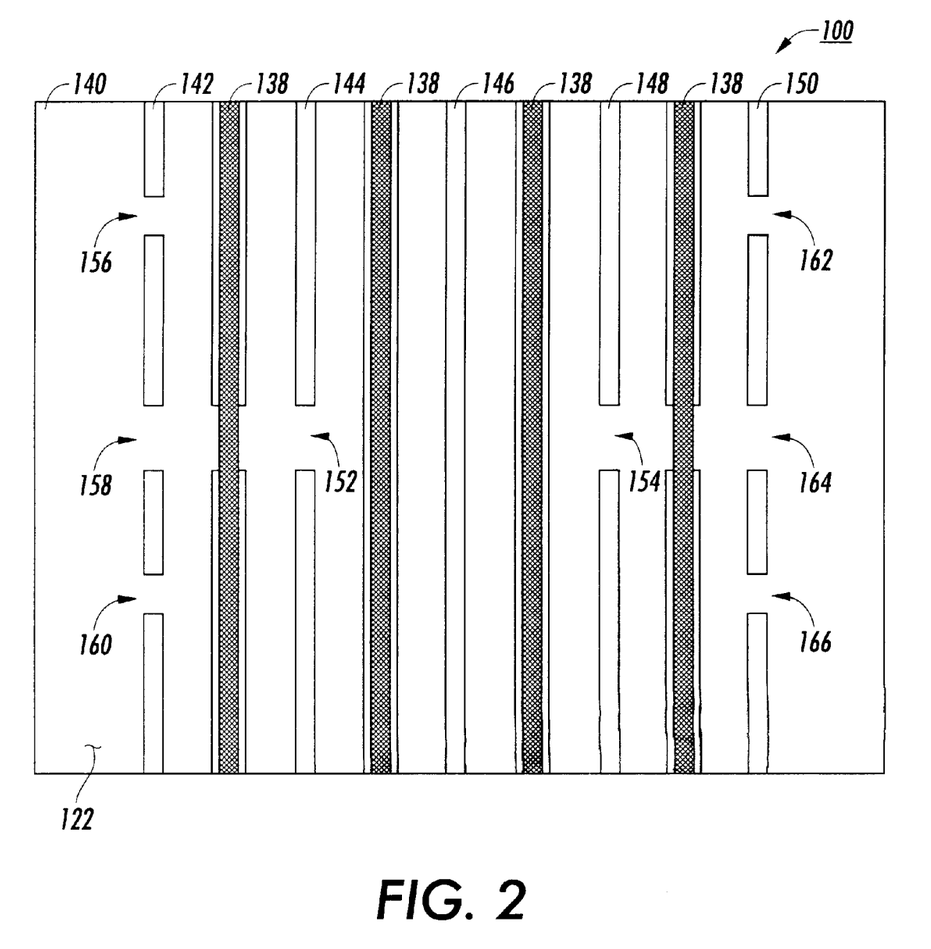
FIG. 2 is a top view of the semiconductor layers of the edge emitting laser array structure of the present invention after masking for etching.

After the layer disordering process is completed, the silicon nitride stripes are removed and an another, different patterned, silicon nitride mask 140 of 80 nanometers thickness is deposited over the entire upper surface 122 of the semiconductor structure 100 as shown in FIG. 2 for etching grooves and lateral wet oxidation.

The semiconductor laser structure 100 is a quad-spot laser, a laser with four separate laser cavities for emitting four separate beams of coherent light.

As shown in the top view of FIG. 2, the silicon mask 140 has five parallel linear groove windows 142, 144, 146, 148 and 150 to form the five parallel grooves within the semiconductor structure. A laser cavities is formed between adjacent grooves.

The center or third groove window 146 is linear with no breaks. The inner or second and fourth groove windows 144 and 148 are linear with one center break 152 and 154, respectively. There will be no groove in the center break. This break will remain a planar surface section for the later formation of the interconnects for the electrodes. The outer or first and fifth groove windows 142 and 150 are linear with three breaks, 156, 158 and 160; and 162, 164 and 166, respectively. There will be no groove in any of the three breaks. These breaks will remain planar surface sections for the later formation of the interconnects for the electrodes.

The intermixed areas 138 are shown equally spaced between adjacent groove windows.

As noted, the silicon nitride mask 140 is formed on the upper surface 122 of the semiconductor structure by a photolithographic process.

Figure 3:
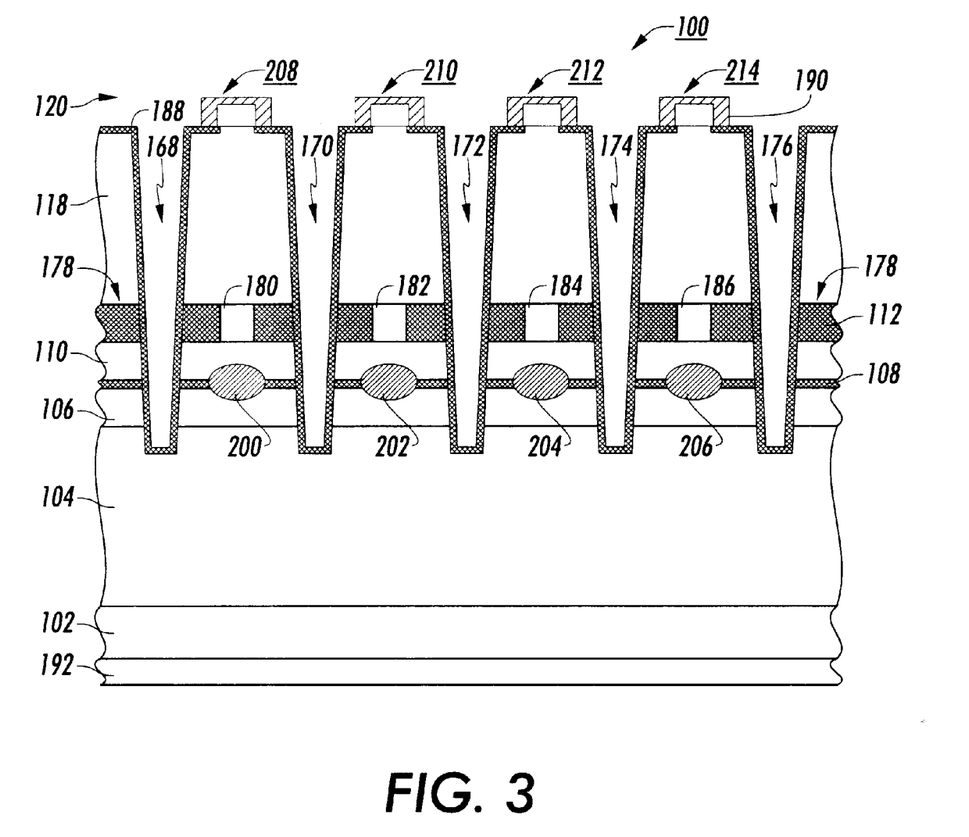
FIG. 3 is a side view of the edge emitting laser array structure of the present invention after etching and lateral wet oxidation.

As shown in FIG. 3, the semiconductor structure 100 is etched in the groove windows within the mask 140 to form grooves 168, 170, 172, 174 and 176. The grooves are etched by a process such as reactive ion etching or wet etching which provides for the formation of a deep depression with near vertical angled sidewalls.

The grooves form a pre-determined intermittent linear pattern which will later be used to define the resulting aperture of the laser structure 100, to define the upper electrode pattern for the laser structure and to provide optical and electrical isolation between adjacent laser cavities.

The grooves 168, 170, 172, 174 and 176 are etched through the cap layer 120, through the upper cladding layer 118, through the oxidation layer 112, through the upper confinement layer 110, the active layer 108, through the lower confinement layer 106 and partially into the lower cladding layer 104. The grooves 168, 170, 172, 174 and 176 are formed from the respective groove windows 142, 144, 146, 148 and 150. Thus, the outer grooves 168 and 176 are linear and intermittent with three breaks (not shown in this Figure), the inner grooves 170 and 174 are linear and intermittent with one break (not shown in this Figure) and the center groove 172 is linear and unbroken.

The linear grooves 168, 170, 172, 174 and 176 specifically expose, along the sidewalls, the oxidation layer 112 and the AlAs layer 114 of the oxidation layer.

The structure then undergoes an oxidation step in a nitrogen environment with water vapor at a temperature of 400 to 450° C. for approximately for an hour until the native oxidation encloses a region 180 of the AlAs layer 114.

During the oxidation process, the oxidation layer 112 is exposed to the ambient through the grooves 168, 170, 172, 174 and 176. Thus, for example, the oxidation layer 112, which comprises of AlGaAs with a high aluminum content, is oxidized inward from the groove 170 through one unintermixed region 178 towards one intermixed region 182 and outwards from the groove 170 through a second unintermixed region 178 towards a second intermixed region 180.

At this point, there exists a difference between the mole fraction of intermixed regions 138 of the AlAs layer 114 and the remaining unintermixed regions of the AlAs layer 114. The difference in aluminum mole fraction creates a disparity in the oxidation rates since the oxidation rate of AlGaAs depends exponentially upon the aluminum mole fraction. For instance, the oxidation rate of AlAs is about 1.5 μm per minute at 450° C. and is about 0.05 μm per minute for AlGaAs with about 80 percent aluminum. Due to this significant difference in the oxidation rates between the intermixed regions 138 and the remaining unintermixed regions of the AlAs layer 114, the oxidation process slows down substantially when it reaches the interface between the intermixed and unintermixed regions.

During the oxidation process, other layers in the structure remain essentially unoxidized since their aluminum content is lower. The oxidation rate of AlGaAs increases with the aluminum content in a generally exponential manner at constant temperature.

Figure 4:
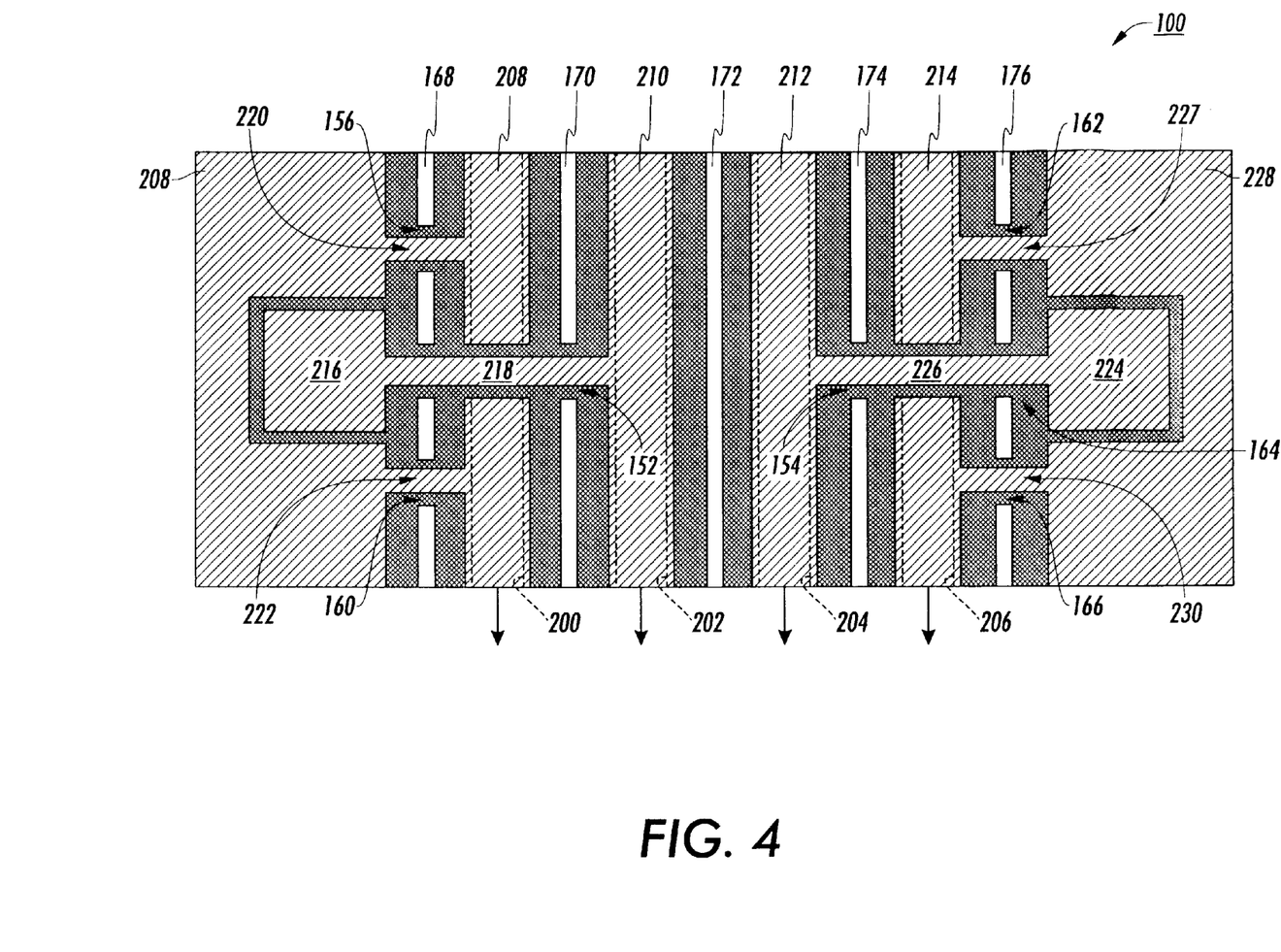
FIG. 4 is a top view of the electrode pattern for independently addressing four laser elements of the edge emitting laser array structure of the present invention.

As shown in the side view of FIG. 3 and the top view of FIG. 4, after oxide formation, a native oxide layer 178 is formed from regions of the AlAs layer 114 of the oxidation layer 112. The native oxide layer 178 surrounds and defines the lateral intermixed regions 180, 182, 184 and 186 which are the laser structure apertures. In addition, these boundaries are relatively smooth and sharp as they are defined by an epitaxial growth process and a photolithography process. Since the photolithography process has a high degree of accuracy, the spacing around the aperture can be minimal. Also, since these oxidized regions are defined after the epitaxial process has been completed, this approach allows for a high degree of process flexibility.

After the silicon nitride mask 140 has been removed, the aperture 180, for example, is surrounded by the native oxide layer 178. The aperture 180 controls the current path through the active layer 108. Current flow through that portion of the active layer 108 which lies below the aperture 180 results in an injected density of p-type and n-type carriers, resulting in optical amplification. At sufficiently high current flow, this optical amplification will result in laser oscillation and emission within aperture 180 through the edge of the laser structure 100.

Either during the etching of the grooves 168, 170, 172, 174 and 176 or in a separate etching step, the cap layer 120 is removed from the surface 122 of the semiconductor structure 100 in the area near the aperture 180, 182, 184 and 186 exposing the upper AlGaAs layer 118 prior to oxidation.

As shown in FIG. 3, the upper portion and sidewalls of the AlGaAs cladding layer 118 are also converted to a native oxide layer 188 during the oxidation process. This layer 188 is highly resistive and electrically isolating. Metal contacts 190 and 292 are formed on the surface 122 of the cap layer 120 and the bottom side of the substrate 102 respectively for biasing the laser. A typical material used for forming the contacts is a titanium/gold bilayer film.

The electrode 190 outside the native oxide aperture regions 180, 182, 184 and 186 lays on top of the native oxide layer 188. The current is confined to flow into the active region through the aperture above the active region, preventing leakage current elsewhere. Although the electrical isolation can be achieved by shallow proton ion implantation, the surface native oxide layer approach is easier and more economic.

The resulting semiconductor laser array structure 100 in FIG. 4 is a quad-spot red laser with four laser elements 200, 202, 204 and 206. Each laser element has a 500 μm long cavity, extending lengthwise in the semiconductor structure 100, and are coated with a high reflection dielectric mirror stack (R>95%) on the rear facet (not shown) and a passivation layer (R~25%) on the front or emission facet (also not shown).

The four laser elements 200, 202, 204 and 206 share a common bottom or n-electrode 192 and have separate, independently addressable, upper or p-electrodes 208, 210, 212 and 214, respectively. Each laser element contains an undoped $Al_{0.4}Ga_{0.6}As$ lower confinement layer 106, a GaAs active layer 108, and an undoped $Al_{0.4}Ga_{0.6}As$ upper confinement layer 110 for light emission through the front facet edge of the laser structure.

Because of the high density of laser elements and close spacing of the elements in the monolithic semiconductor structure, electrical contacts to the inner stripe laser elements 302 and 304 require special patterning, as illustrated in FIG. 4.

To facilitate electrical interconnect from a contact pad 216 to the inner stripe electrode 210, the narrow breaks or windows 152 and 158 are opened across the grooves 168 and 170 to allow the exposed upper surface of the upper cladding layer to oxidize as well. The window is not metallized like the electrode but rather is the native oxide layer 188 and is formed in the photolithographic masking and etching process. The breaks or windows 152 and 156 enables the metal interconnect electrode 218 for the inner stripe electrode 210 to run across the grooves 168 and 170 to a large contact pad 216. The breaks or windows 152 and 156 across the grooves are 10 μm wide. By contrast, the laser cavity in this embodiment is 500 μm long. The two halves of the electrode 208 are connected by interconnect electrode 220 across the break or window 156 to the contact pad 222 and connected by interconnect electrode 224 across the break or window 160 to the same contact pad 222. The contact pads 216 and 222 are on the same side of the stripe electrodes, outside the outer electrode 208.

The breaks or windows 152 and 158 across the grooves 168 and 170 do not affect the emission operation of the underlying laser element 200.

Similarly, to facilitate electrical interconnect from a contact pad 224 to the inner stripe electrode 212, the narrow breaks or windows 154 and 164 are opened across the grooves 174 and 176 to allow the exposed upper surface of the upper cladding layer to oxidize as well. The window is not metallized like the electrode but rather is the native oxide layer 188 and is formed in the photolithographic masking and etching process. The breaks or windows 174 and 176 enables the metal interconnect electrode 226 for the inner stripe electrode 212 to run across the grooves 174 and 176 to a large contact pad 224.

The two halves of the electrode 214 are connected by interconnect electrode 226 across the break or window 162 to the contact pad 228 and connected by interconnect electrode 230 across the break or window 166 to the same contact pad 228. The contact pads 224 and 228 are on the same side of the stripe electrodes, outside the outer electrode 214.

The breaks or windows 154 and 164 across the grooves 174 and 176 do not affect the emission operation of the underlying laser element 206.

The use of windows and interconnect electrodes for the inner stripe electrodes with contact pads on the outside of the electrode stripes permits a high density of laser elements which are still independently addressable.

Figure 5:
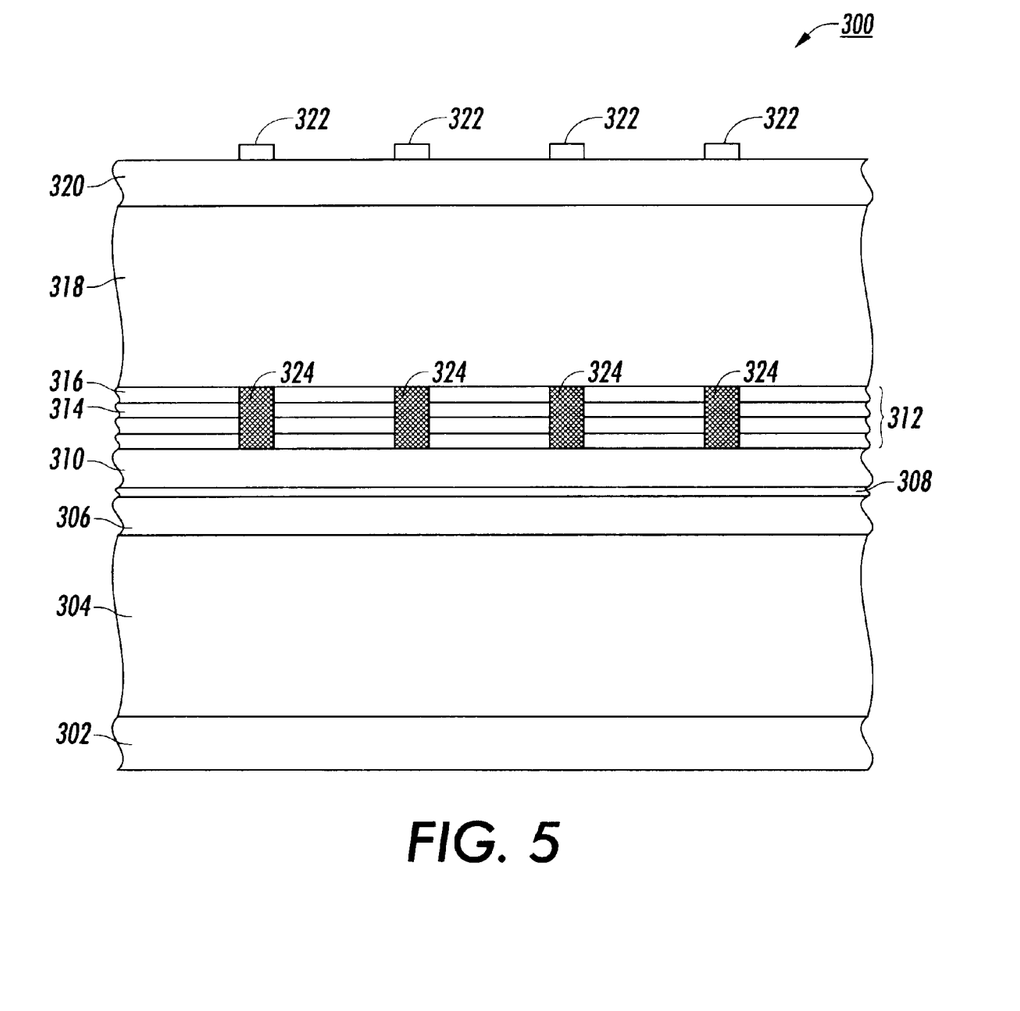
FIG. 5 is a side view of the second embodiment of the semiconductor layers of the edge emitting laser array structure of the present invention with the conductivity types reversed.

FIG. 5 illustrates a second embodiment of an independently addressable, high density semiconductor laser structure 300 fabricated by selective layer intermixing and lateral wet oxidation in accordance to the present invention.

The semiconductor structure 300 of FIG. 5 is the same as the semiconductor structure 100 of FIGS. 1 and 3 except the p and n conductivity types of the semiconductor layers are reversed with the undoped layers remaining undoped. And the silicon nitride stripes for the layer disordering in FIG. 5 cover the oxidation layer to be intermixed.

The semiconductor structure 300 has a p-GaAs substrate 302 upon which is epitaxially deposited a 1 micron thick p-type $Al_{0.7}Ga_{0.3}As$ lower cladding layer 304, a 120 nanometer thick undoped $Al_{0.4}Ga_{0.6}As$ lower confinement layer 306, an 8 nanometer thick GaAs active layer 308, and a 120 nanometer thick undoped $Al_{0.4}Ga_{0.6}As$ upper confinement layer 310.

After the upper AlGaAs confinement layer 310 has been formed, an n-type oxidation layer 312 is deposited of a superlattice of five semiconductor layer pairs of 10 nanometer thick n-AlAs layers 314 and 10 nanometer thick $n-Al_{0.4}Ga_{0.6}As$ layers 316.

After the oxidation layer 312 has been formed, a n-type $Al_{0.7}Ga_{0.3}As$ upper cladding layer 318 of about one micron thickness is deposited. Upon the upper p-type $Al_{0.7}Ga_{0.3}As$ cladding layer 318 is deposited a p+-GaAs cap layer 320 to facilitate the formation of ohmic contacts to the laser structure. The p+-GaAs cap layer 320 is typically 100 nanometers thick with a magnesium doping of $1\times10^{19}$ cm$^{-3}$.

Silicon nitride stripes 322 for layer disordering are photolithographically deposited and patterned on the upper surface of the semiconductor structure. The intermixed regions 324 will be formed in the oxidation layer 312 below the stripes 322. The layer intermixing, the etching of grooves, the lateral deep wet oxidation and the fabrication of electrodes are the same for both semiconductor laser structures 100 and 300 with the same result of a quad-spot laser.

Figure 6:
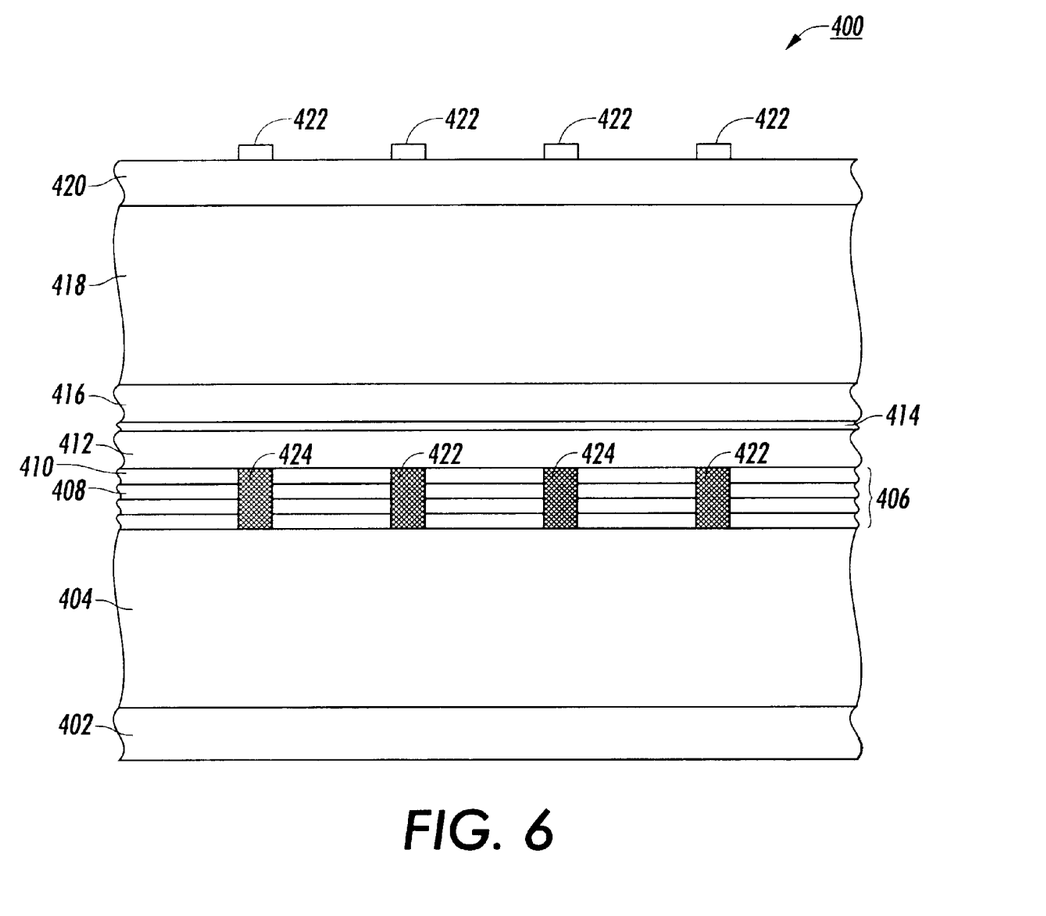
FIG. 6 is a side view of the third embodiment of the semiconductor layers of the edge emitting laser array structure of the present invention with the oxidation layer below the active region.

FIG. 6 illustrates a third embodiment of an independently addressable, high density semiconductor laser structure 400 fabricated by selective layer intermixing and lateral wet oxidation in accordance with the present invention. The semiconductor structure 400 is similar to the semiconductor structure 100 of FIGS. 1 and 3 except that the oxidation layer is n-type, doped with silicon, and between the lower cladding layer and the lower confinement layer, and thus below the active region/layer. And the silicon nitride stripes for the layer disordering in FIG. 6 cover the oxidation layer to be intermixed.

The semiconductor structure 400 has a n-GaAs substrate 402 upon which is epitaxially deposited a 1 micron thick n-type $Al_{0.7}Ga_{0.3}As$ lower cladding layer 404.

After the lower AlGaAs confinement layer 404 has been formed, an n-type oxidation layer 406 is deposited of a superlattice of five semiconductor layer pairs of 10 nanometer thick p-AlAs layers 408 and 10 nanometer thick $p-Al_{0.4}Ga_{0.6}As$ layers 410.

After the oxidation layer 406 has been formed, a 120 nanometer thick undoped $Al_{0.4}Ga_{0.6}As$ lower confinement layer 412, an 8 nanometer thick GaAs active layer 414, and a 120 nanometer thick undoped $Al_{0.4}Ga_{0.6}As$ upper confinement layer 416 are deposited.

After the upper AlGaAs confinement layer 416 has been formed, a p-type $Al_{0.7}Ga_{0.3}As$ upper cladding layer 418 of about one micron thickness is deposited. Upon the upper p-type $Al_{0.7}Ga_{0.3}As$ cladding layer 418 is deposited a p+-GaAs cap layer 420 to facilitate the formation of ohmic contacts to the laser structure. The p+-GaAs cap layer 420 is typically 100 nanometers thick with a magnesium doping of $1\times10^{19}$ cm$^{-3}$.

Silicon nitride stripes 422 for layer disordering are photolithographically deposited and patterned on the upper surface of the semiconductor structure. The intermixed regions 424 will be formed in the oxidation layer 406 below the stripes 422. The layer intermixing, the etching of grooves, the lateral deep wet oxidation and the fabrication of electrodes are the same for both semiconductor laser structures 100 and 400 with the same result of a quad-spot laser.

Figure 7:
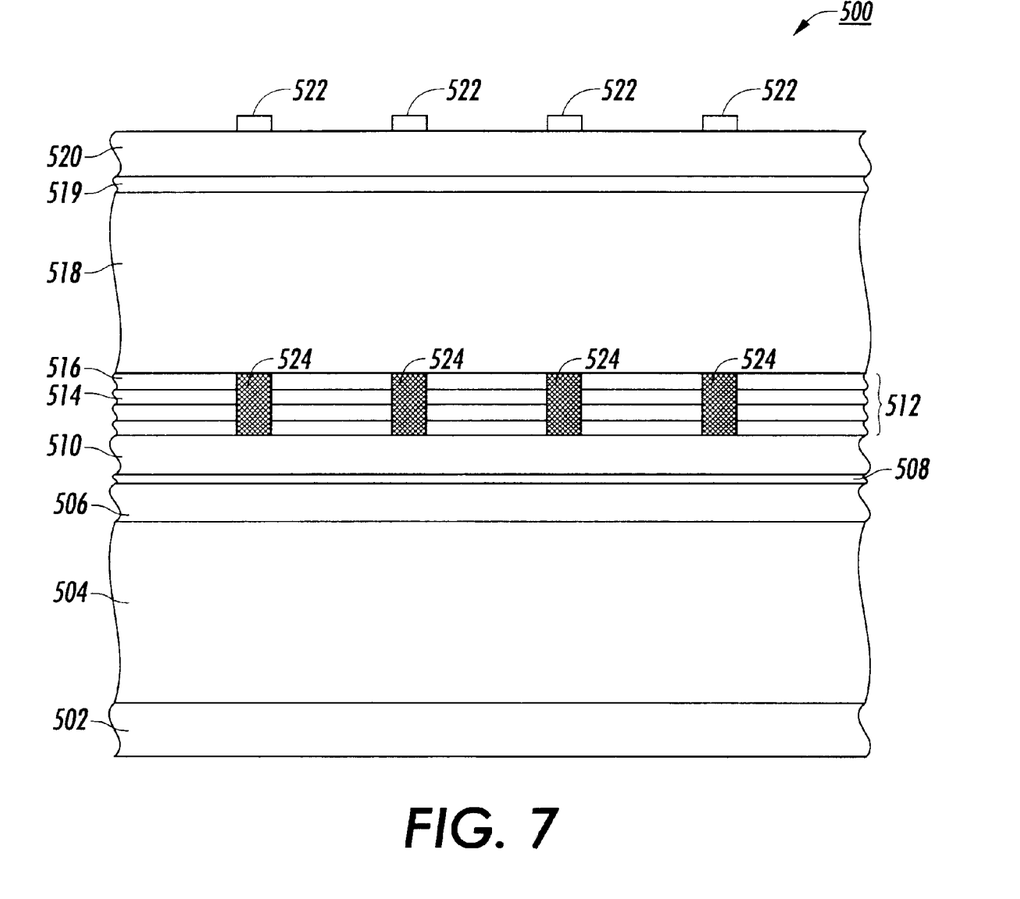
FIG. 7 is a side view of the fourth embodiment of the semiconductor layers of the edge emitting laser array structure of the present invention with alternate semiconductor materials.

FIG. 7 illustrates a fourth embodiment of an independently addressable, high density semiconductor laser structure 500 fabricated by selective layer intermixing and lateral wet oxidation in accordance with the present invention.

The semiconductor structure 500 of FIG. 7 is the same as the semiconductor structure 100 of FIGS. 1 and 3 except the semiconductor layers for laser structure 500 are from the AlInP, AlGaInP and InGaP alloy family to provide light emission in the visible red spectrum and an additional cap layer is added. And the silicon nitride stripes for the layer disordering in FIG. 7 cover the oxidation layer to be intermixed.

The semiconductor structure 500 has a n-GaAs substrate upon which is epitaxially deposited a 1 micron thick n-type $Al_{0.5}In_{0.5}P$ lower cladding layer 504, a 120 nanometer thick undoped $(Al_{0.5}Ga_{0.5})_{0.5}In_{0.5}P$ lower confinement layer 506, an 8 nanometer thick InGaP active layer 508, and a 120 nanometer thick undoped $(Al_{0.5}Ga_{0.5})_{0.5}In_{0.5}P$ upper confinement layer 510.

After the upper AlGaInP confinement layer 510 has been formed, an undoped oxidation layer 512 is deposited of a superlattice of five semiconductor layer pairs of 10 nanometer thick AlAs layers 514 and 10 nanometer thick $Al_{0.7}Ga_{0.3}As$ layers 516.

After the oxidation layer 512 has been formed, a p-type upper cladding $Al_{0.5}In_{0.5}P$ layer 518 of about one micron thickness is deposited. Upon the upper p-type $Al_{0.5}In_{0.5}P$ cladding layer 518 is deposited a $Ga_{0.5}In_{0.5}P$ layer 519, which typically has a thickness of 50 nanometers, and a magnesium doping level of approximately $2\times10^{18}$ cm$^{-3}$. This GaInP layer 519, along with a p+-GaAs cap layer 520, facilitate the formation of ohmic contacts to the laser structure. The p+-GaAs cap layer 520 is typically 100 nanometers thick with a magnesium doping of $1\times10^{19}$ cm$^{-3}$.

Silicon nitride stripes 522 for layer disordering are photolithographically deposited and patterned on the upper surface of the semiconductor structure. The intermixed regions 524 will be formed in the oxidation layer 312 below the stripes 522. The layer intermixing, the etching of grooves, the lateral deep wet oxidation and the fabrication of electrodes are the same for both semiconductor laser structures 100 and 500 with the same result of a quad-spot laser.

The semiconductor laser structure 500 of FIG. 7 can have a n or p conductivity type AlAs/AlGaAs superlattice oxidation layer or an undoped superlattice oxidation layer. Since InGaP/AlGaInP quantum well active layers are very stable under silicon dioxide masking during the high temperature anneal, vacancy enhanced layer disordering technique under a $SiO_2$ mask may be used to define intermixed apertures without disordering the active region.

The oxidation layer of the five pairs of $AlAs/Al_{0.4}Ga_{0.6}As$ superlattice structure in any of the embodiments may have the AlAs replaced by $Al_xGa_{1-x}As$ (x>0.95) to form the optical aperture.

There are several advantages to using the wet oxidation technique for the fabrication of monolithic laser arrays. First, wet oxidation will replace the etching and regrowth approach used for defining buried ridge devices, leading to higher yield and better diode performance. Second, it is easy to make electrical interconnects to the inner stripes, which eliminates ion-implantation needed for electrical isolation. Third, it is possible to design device layout beyond quad-spot lasers such as hexa-spot and octa-spot lasers.

The composition, dopants, doping levels, and dimensions given above are exemplary only, and variations in these parameters are permissible. Additionally, other layers in addition to the ones shown in the figures may also be included. Variations in experimental conditions such as temperature and time are also permitted. Lastly, instead of GaAs and GaAlAs, other semiconductor materials such as GaAlSb, InAlGaP, or other aluminum-containing III-V alloys may also be used.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. An array of edge emitting lasers, each of said edge emitting lasers comprising:
    a substrate;
    a plurality of semiconductor layers formed on said substrate;
    one or more of said plurality of semiconductor layers forming an active region;
    an aperture which controls current flowing through said active region, said aperture formed of an intermixed region of said plurality of semiconductor layers, said aperture defined by native oxide layers, said native oxide layers extending from intermittent linear grooves formed in said plurality of semiconductor layers;
    said native oxide layers also providing electrical isolation for adjacent edge emitting lasers in said array; and
    first and second electrodes which enable biasing of said active region.

2. The array of edge emitting lasers of claim 1 wherein said native oxide layers comprise a native oxide of an aluminum-containing semiconductor material.

3. The array of edge emitting lasers of claim 1 wherein said plurality of semiconductor layers comprises a Group III-V phosphide material.

4. The array of edge emitting lasers of claim 1 wherein said first electrode includes multiple stripe electrodes extending along the upper surface of said plurality of semiconductor layers and each stripe electrode having a corresponding contact pad.

5. The array of edge emitting lasers of claim 4 wherein a plurality of said multiple stripe electrodes have a window exposing a native oxide layer allowing an interconnect electrode to connect another stripe electrode to its corresponding contact pad.

6. The array of edge emitting lasers of claim 5 wherein said array comprises four edge emitting lasers.

7. The array of edge emitting lasers of claim 1 wherein said intermixed region is formed by a layer disordering process.

8. The array of edge emitting lasers of claim 1 further comprising a second native oxide layer wherein a portion of said first electrode is on said second native oxide layer.

9. An array of edge emitting lasers, each of said edge emitting lasers comprising:
    a substrate;
    a first cladding layer of a first conductivity type formed on said substrate;
    a first confinement layer, an active layer, and a second confinement layer forming an active region on said first cladding layer;
    an oxidation layer of alternating semiconductor layers of different semiconductor materials formed on said active region;
    an aperture which controls current flowing through said active region, said aperture formed of an intermixed region of said oxidation layer, said aperture defined by native oxide layers, said native oxide layers extending from grooves formed in said oxidation layers;
    said native oxide layers also providing electrical isolation for adjacent edge emitting lasers in said array;
    a second cladding layer and a contact layer of a second conductivity type formed on said oxidation layer, said grooves extending through said second cladding layer and said contact layer; and
    first and second electrodes which enable biasing of said active region.

10. The array of edge emitting lasers of claim 9 wherein said native oxide layers comprise a native oxide of an aluminum-containing semiconductor material.

11. The array of edge emitting lasers of claim 9 wherein a plurality of said confinement and cladding layers comprises a Group III-V phosphide material.

12. The array of edge emitting lasers of claim 9 wherein said first electrode includes multiple stripe electrodes extending along the upper surface of said plurality of semiconductor layers and each stripe electrode having a corresponding contact pad.

13. The array of edge emitting lasers of claim 12 wherein a plurality of said multiple stripe electrodes have a window exposing a native oxide layer allowing an interconnect electrode to connect another stripe electrode to its corresponding contact pad.

14. The array of edge emitting lasers of claim 13 wherein said array comprises four edge emitting lasers.

15. The array of edge emitting lasers of claim 9 wherein said intermixed region is formed by a layer disordering process.

16. The array of edge emitting lasers of claim 9 further comprising a second native oxide layer wherein a portion of said first electrode is on said second native oxide layer.

17. The array of edge emitting lasers of claim 9 wherein said first conductivity type is n-type and said second conductivity type is p-type.

18. The array of edge emitting lasers of claim 17 wherein said first cladding layer is $Al_{0.7}Ga_{0.3}As$, said second cladding layer is $Al_{0.7}Ga_{0.3}As$, said first confinement layer is $Al_{0.4}Ga_{0.6}As$, said second confinement layer is $Al_{0.4}Ga_{0.6}As$, said active layer is GaAs, and said oxidation layer is alternating semiconductor layers of AlAs and $Al_{0.4}Ga_{0.6}As$.

19. The array of edge emitting lasers of claim 17 wherein said first cladding layer is $Al_{0.5}In_{0.5}P$, said second cladding layer is $Al_{0.5}In_{0.5}P$, said first confinement layer is $(Al_{0.5}Ga_{0.5})_{0.5}In_{0.5}P$, said second confinement layer is $(Al_{0.5}Ga_{0.5})_{0.5}In_{0.5}P$, said active layer is InGaP, and said oxidation layer is alternating semiconductor layers of AlAs and $Al_{0.7}Ga_{0.3}As$.

20. The array of edge emitting lasers of claim 17 wherein said first cladding layer is $Al_{0.7}Ga_{0.3}As$, said second cladding layer is $Al_{0.7}Ga_{0.3}As$, said first confinement layer is $Al_{0.4}Ga_{0.6}As$, said second confinement layer is $Al_{0.4}Ga_{0.6}As$, said active layer is GaAs, and said oxidation layer is alternating semiconductor layers of $Al_xGa_{1-x}As$ where x is greater than 0.95 and $Al_{0.4}Ga_{0.6}As$.

21. The array of edge emitting lasers of claim 17 wherein said first cladding layer is $Al_{0.5}In_{0.5}P$, said second cladding layer is $Al_{0.5}In_{0.5}P$, said first confinement layer is $(Al_{0.5}Ga_{0.5})_{0.5}In_{0.5}P$, said second confinement layer is $(Al_{0.5}Ga_{0.5})_{0.5}In_{0.5}P$, said active layer is InGaP, and said oxidation layer is alternating semiconductor layers of $Al_xGa_{1-x}As$ where x is greater than 0.95 and $Al_{0.7}Ga_{0.3}As$.

22. The array of edge emitting lasers of claim 9 wherein said first conductivity type is p-type and said second conductivity type is n-type.

23. The array of edge emitting lasers of claim 22 wherein said first cladding layer is $Al_{0.7}Ga_{0.3}As$, said second cladding layer is $Al_{0.7}Ga_{0.3}As$, said first confinement layer is $Al_{0.4}Ga_{0.6}As$, said second confinement layer is $Al_{0.4}Ga_{0.6}As$, said active layer is GaAs, and said oxidation layer is alternating semiconductor layers of AlAs and $Al_{0.4}Ga_{0.6}As$.

24. An array of edge emitting lasers, each of said edge emitting lasers comprising:
   a substrate;
   a first cladding layer of a first conductivity type formed on said substrate;
   a first confinement layer, an active layer, and a second confinement layer forming an active region on said first cladding layer;
   an oxidation layer of alternating semiconductor layers of different semiconductor materials formed on said active region;
   an aperture which controls current flowing through said active region, said aperture formed of a region of said oxidation layer, said aperture defined by native oxide layers, said native oxide layers extending from grooves formed in said oxidation layers;
   said native oxide layers also providing electrical isolation for adjacent edge emitting lasers in said array;
   a second cladding layer and a contact layer of a second conductivity type formed on said oxidation layer, said grooves extending through said second cladding layer and said contact layer; and
   first and second electrodes which enable biasing of said active region.

25. The array of edge emitting lasers of claim 24 wherein said native oxide layers comprise a native oxide of an aluminum-containing semiconductor material.

26. The array of edge emitting lasers of claim 24 wherein a plurality of said confinement and cladding layers comprises a Group III–V phosphide material.

27. The array of edge emitting lasers of claim 24 wherein said first electrode includes multiple stripe electrodes extending along the upper surface of said plurality of semiconductor layers and each stripe electrode having a corresponding contact pad.

28. The array of edge emitting lasers of claim 27 wherein a plurality of said multiple stripe electrodes have a window exposing a native oxide layer allowing an interconnect electrode to connect another stripe electrode to its corresponding contact pad.

29. The array of edge emitting lasers of claim 28 wherein said array comprises four edge emitting lasers.

30. The array of edge emitting lasers of claim 24 further comprising a second native oxide layer wherein a portion of said first electrode is on said second native oxide layer.

31. The array of edge emitting lasers of claim 24 wherein said first conductivity type is n-type and said second conductivity type is p-type.

32. The array of edge emitting lasers of claim 31 wherein said first cladding layer is $Al_{0.5}In_{0.5}P$, said second cladding layer is $Al_{0.5}In_{0.5}P$, said first confinement layer is $(Al_{0.5}Ga_{0.5})_{0.5}In_{0.5}P$, said second confinement layer is $(Al_{0.5}Ga_{0.5})_{0.5}In_{0.5}P$, said active layer is InGaP, and said oxidation layer is alternating semiconductor layers of AlAs and $Al_{0.7}Ga_{0.3}As$.

33. The array of edge emitting lasers of claim 31 wherein said first cladding layer is $Al_{0.5}In_{0.5}P$, said second cladding layer is $Al_{0.5}In_{0.5}P$, said first confinement layer is $(Al_{0.5}Ga_{0.5})_{0.5}In_{0.5}P$, said second confinement layer is $(Al_{0.5}Ga_{0.5})_{0.5}In_{0.5}P$, said active layer is InGaP, and said oxidation layer is alternating semiconductor layers of $Al_xGa_{1-x}As$ where x is greater than 0.95 and $Al_{0.7}Ga_{0.3}As$.

34. An array of edge emitting lasers, each of said edge emitting lasers comprising:
   a substrate;
   a first cladding layer of a first conductivity type formed on said substrate;
   an oxidation layer of alternating semiconductor layers of different semiconductor materials formed on said first cladding layer;
   an aperture which controls current flowing through an active region, said aperture formed of an intermixed region of said oxidation layer, said aperture defined by native oxide layers, said native oxide layers extending from grooves formed in said oxidation layers;
   said native oxide layers also providing electrical isolation for adjacent edge emitting lasers in said array; a first confinement layer, an active layer, and a second confinement layer forming said active region on said oxidation layer;
   a second cladding layer and a contact layer of a second conductivity type formed on said active region, said grooves extending through said second cladding layer and said contact layer; and
   first and second electrodes which enable biasing of said active region.

35. The array of edge emitting lasers of claim 34 wherein said native oxide layers comprise a native oxide of an aluminum-containing semiconductor material.

36. The array of edge emitting lasers of claim 34 wherein said first electrode includes multiple stripe electrodes extending along the upper surface of said plurality of semiconductor layers and each stripe electrode having a corresponding contact pad.

37. The array of edge emitting lasers of claim 36 wherein a plurality of said multiple stripe electrodes have a window exposing a native oxide layer allowing an interconnect electrode to connect another stripe electrode to its corresponding contact pad.

38. The array of edge emitting lasers of claim 37 wherein said array comprises four edge emitting lasers.

39. The array of edge emitting lasers of claim 34 wherein said intermixed region is formed by a layer disordering process.

40. The array of edge emitting lasers of claim 34 further comprising a second native oxide layer wherein a portion of said first electrode is on said second native oxide layer.

41. The array of edge emitting lasers of claim 34 wherein said first conductivity type is n-type and said second conductivity type is p-type.

42. The array of edge emitting lasers of claim 41 wherein said first cladding layer is $Al_{0.7}Ga_{0.3}As$, said second cladding layer is $Al_{0.7}Ga_{0.3}As$, said first confinement layer is $Al_{0.4}Ga_{0.6}As$, said second confinement layer is $Al_{0.4}Ga_{0.6}As$, said active layer is GaAs, and said oxidation layer is alternating semiconductor layers of AlAs and $Al_{0.4}Ga_{0.6}As$.

43. The array of edge emitting lasers of claim 41 wherein said first cladding layer is $Al_{0.7}Ga_{0.3}As$, said second cladding layer is $Al_{0.7}Ga_{0.3}As$, said first confinement layer is $Al_{0.4}Ga_{0.6}As$, said second confinement layer is $Al_{0.4}Ga_{0.6}As$, said active layer is GaAs, and said oxidation layer is alternating semiconductor layers of $Al_xGa_{1-x}As$ where x is greater than 0.95 and $Al_{0.4}Ga_{0.6}As$.

\* \* \* \* \*

UNITED STATES PATENT AND TRADEMARK OFFICE
CERTIFICATE OF CORRECTION

PATENT NO.    : 5,917,847

DATED         : June 29, 1999

INVENTOR(S)   : Decai Sun

It is certified that error appears in the above-identified patent and that said Letters Patent is hereby corrected as shown below:

Column 8, line 49, change "226" to --227--.

Signed and Sealed this

Third Day of October, 2000

Attest:

Q. TODD DICKINSON

*Attesting Officer*     *Director of Patents and Trademarks*

UNITED STATES PATENT AND TRADEMARK OFFICE
CERTIFICATE OF CORRECTION

PATENT NO. : 5,917,847 Page 1 of 1
APPLICATION NO. : 08/938087
DATED : June 29, 1999
INVENTOR(S) : Decai Sun

It is certified that error appears in the above-identified patent and that said Letters Patent is hereby corrected as shown below:

Column 1, line 5, insert as a new paragraph:

This invention was madw with Government support under Agreement No. 70NANB2H1241 awarded by the Department of Commerce. The Government has certain rights in this invention.

Signed and Sealed this

Twenty-eighth Day of August, 2007

JON W. DUDAS
*Director of the United States Patent and Trademark Office*